(12) United States Patent
Ao

(10) Patent No.: US 11,388,851 B2
(45) Date of Patent: Jul. 12, 2022

(54) COMPONENT MOUNTER

(71) Applicant: FUJI CORPORATION, Aichi (JP)

(72) Inventor: Hiroyuki Ao, Okazaki (JP)

(73) Assignee: FUJI CORPORATION, Chiryu (JP)

( * ) Notice: Subject to any disclaimer, the term of this patent is extended or adjusted under 35 U.S.C. 154(b) by 0 days.

(21) Appl. No.: 16/978,828

(22) PCT Filed: Mar. 9, 2018

(86) PCT No.: PCT/JP2018/009345
§ 371 (c)(1),
(2) Date: Sep. 8, 2020

(87) PCT Pub. No.: WO2019/171602
PCT Pub. Date: Sep. 12, 2019

(65) Prior Publication Data
US 2020/0413582 A1 Dec. 31, 2020

(51) Int. Cl.
*B23P 19/00* (2006.01)
*H05K 13/04* (2006.01)
*H05K 13/08* (2006.01)

(52) U.S. Cl.
CPC ..... *H05K 13/0452* (2013.01); *H05K 13/0812* (2018.08)

(58) Field of Classification Search
CPC ........... H05K 13/0409; H05K 13/0452; H05K 13/0812; H05K 13/083
See application file for complete search history.

(56) References Cited

U.S. PATENT DOCUMENTS 10,362,719 B2 * 7/2019 Iisaka ................ H05K 13/0408

FOREIGN PATENT DOCUMENTS

| EP | 1 529 424 A1 | 5/2005 |
| EP | 3 071 007 A1 | 9/2016 |
| JP | 2003-60394 A | 2/2003 |
| JP | 2012-248815 A | 12/2012 |
| WO | WO 2004/016064 A1 | 2/2004 |

OTHER PUBLICATIONS

International Search Report dated May 15, 2018in PCT/JP2018/009345 filed Mar. 9, 2018, 1 page.

* cited by examiner

*Primary Examiner* — Paul D Kim
(74) *Attorney, Agent, or Firm* — Oblon, McClelland, Maier & Neustadt, L.L.P.

(57) ABSTRACT

A component mounter includes a mounting tool to receive the electronic component in a component supply position and release the electronic component at a predetermined position on the board; an accommodation section accommodating mounting tools of multiple types; a head configured to detachably mount thereon a single mounting tool selected from the mounting tools of the multiple types in the accommodation section; a moving mechanism to move the head between the component supply position and the predetermined position on the board; an abnormality detecting section to detect an abnormality in relation to the mounting tool; and a selection section to select the mounting tool to be mounted on the head, and select a mounting tool of a second type, which differs from the mounting tool of a first type which is being mounted on the head, when the abnormality is detected by the abnormality detecting section.

4 Claims, 5 Drawing Sheets

COMPONENT MOUNTER

TECHNICAL FIELD

A technology disclosed in the present description relates to a component mounter for mounting an electronic component on a board.

BACKGROUND ART

In component mounters for mounting electronic components on boards, there is a component mounter in which an electronic component is picked up with a nozzle detachably mounted on a head, and the electronic component so picked up is moved to be disposed in a predetermined position on a board. In such a component mounter, when something abnormal is detected in relation to the nozzle, the nozzle mounted on the head is exchanged. As the abnormality in relation to the nozzle, there is raised, for example, abnormality in which the nozzle cannot pick up a component while the component mounter is performing a mounting process or abnormality in which a loss of a component or a positional deviation of a component is found existing on a completed board in an inspection carried out after the components are mounted on the board. This type of abnormality occurs when abnormality such as a defect occurs in the nozzle. Due to this, in the case that this type of abnormality is detected, the nozzle mounted on the head is exchanged for another nozzle of the same type. For example, JP-A-2012-248815 discloses an example of a component mounter.

BRIEF SUMMARY

Technical Problem

In a conventional component mounter, in the event that abnormality is detected in the component mounter, the nozzle mounted on the head is exchanged for another nozzle of the same type. On the other hand, in the component mounter, abnormality may be detected from time to time in which a normal mounting operation is not executed even though abnormality such as a defect is not caused in the nozzle. In such a case, since no abnormality occurs in the nozzle itself, the abnormality remains unsolved even though the nozzle on the head is exchanged for another nozzle of the same type. The present description discloses a technology for resolving abnormality occurring in a component mounter in a preferred fashion.

Solution to Problem

A component mounter disclosed in the present description mounts an electronic component on a board. The component mounter includes a mounting tool configured to receive the electronic component in a component supply position and release the electronic component so received in a predetermined position on the board; an accommodation section accommodating mounting tools of multiple types; a head configured to detachably mount thereon a single mounting tool selected from the mounting tools of multiple types accommodated in the accommodation section; a moving mechanism configured to move the head between the component supply position and the predetermined position on the board; an abnormality detecting section configured to detect abnormality in relation to the mounting tool; and a selection section configured to select the mounting tool to be mounted on the head, and select a mounting tool of a second type, which differs from the mounting tool of a first type which is being mounted on the head, when the abnormality is detected by the abnormality detecting section.

In the component mounter described above, the abnormality detecting section detects abnormality in relation to the mounting tool. When the abnormality detecting section detects abnormality, the selection section can select the mounting tool of the second type which differs from the mounting tool of the first type which is being mounted on the head. Among various types of abnormality occurring in the component mounter, there is abnormality which is caused because the type of the mounting tool mounted on the head is not suited. To cope with this problem, the abnormality occurring in the component mounter as described above can properly be resolved by mounting the mounting tool of the different type on the head.

DESCRIPTION OF EMBODIMENTS

Figure 1:
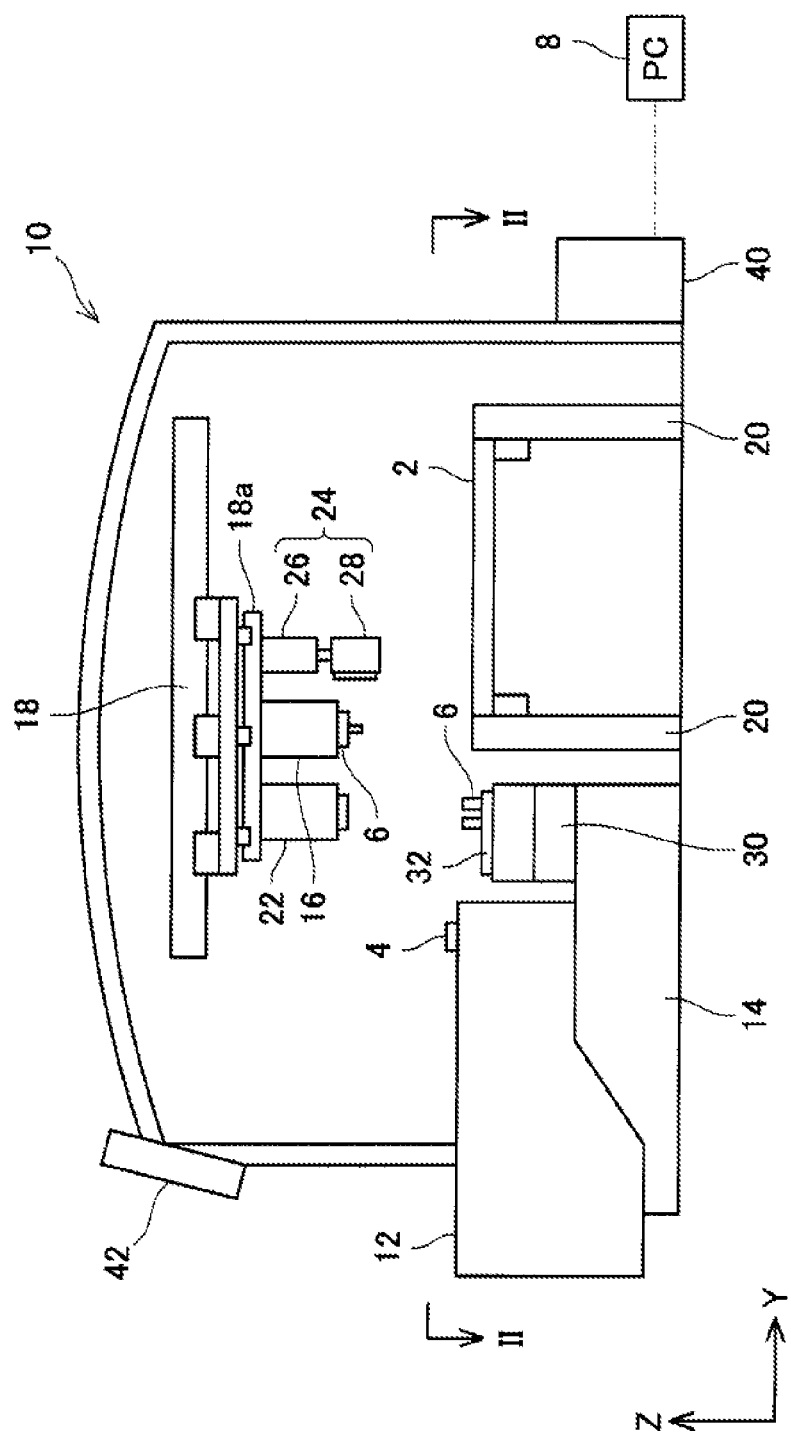
FIG. 1 is a drawing showing a schematic configuration of a component mounter according to Embodiments 1 and 2.

Main features of an embodiment, which will be described below, will be listed. Technical elements, which will be described below, are each independent technical elements and are designed to exhibit technical usefulness alone or by being combined together in various ways, and the combinations are not limited to those described in claims made for the patent application.

A component mounter disclosed in the present description may include further an imaging device for capturing an image of a board on which electronic components are mounted. Abnormality may include a positional deviation of an electronic component on the board which is detected from the captured image. A mounting tool of a second type may be able to hold an electronic component which is larger in size than an electronic component a mounting tool of a first type can hold. According to this configuration, an abnormality detecting section detects a positional deviation of an electronic component on the board from the captured image. The positional deviation of an electronic component may be caused in the case that the size of the electronic component which is held by the mounting tool mounted on a head is too large relative to the mounting tool in question. As a result, in such a case, the positional deviation of an electronic component can be avoided by mounting a mounting tool of such a type that can hold a large electronic component on the head. The mounting tool of the second type can hold an electronic component which is larger than an electronic component the mounting tool of the first type can hold. That is, the selection section selects the mounting tool of a type which can hold a larger electronic component so as to exchange the mounting tool being mounted on the head for the mounting tool of the second type so selected, thereby making it possible to suppress the occurrence of a positional deviation of an electronic component.

The component mounter disclosed in the present description may further include an imaging device configured to capture an image of the mounting tool which is moving an electronic component from a component supply position towards a predetermined position on the board and an image of the electronic component. Abnormality may include a posture deviation of the electronic component in motion which is detected from the captured image. The mounting tool of the second type may be able to move an electronic component which is larger than an electronic component the mounting tool of the first type can hold. According to this configuration, the abnormality detecting section detects a posture deviation of the electronic component in motion from the captured image. The positional deviation described above may occur in the case that the electronic component in motion is too large relative to the mounting tool mounted on the head. The selection section selects a mounting tool of a type that can move an electronic component which is larger than the mounting tool being mounted on the head can move so as to exchange the mounting tool on the head for the mounting tool of the second type so selected, thereby making it possible to suppress the occurrence of a posture deviation of the electronic component in motion.

The component mounter disclosed in the present description may include a control section configured to control the exchange processing operation of exchanging mounting tools which are mounted on the head. In the case that the selection section selects the mounting tool of the second type with the mounting tool of the second type being accommodated in an accommodation section, the control section may execute the exchange processing operation so that the mounting tool of the second type is mounted on the head. According to this configuration, when the selection section selects a mounting tool of a different type, the control section causes the mounting tool so selected to be mounted on the head. As a result, even though the operator does not exchange the mounting tools, the component mounter exchanges the mounting tools so as to eliminate abnormality.

In the component mounter disclosed in the present description, the abnormality detecting section may detect abnormality of a first type in which the component mounter can continue the mounting operation, and abnormality of a second type in which the component mounter cannot continue the execution of the mounting operation. The selection section may be able to select the mounting tool of the second type which differs from the mounting tool of the first type which is being mounted on the head when the abnormality detected by the abnormality detecting section is the abnormality of the first type. According to this configuration, when the abnormality of the first type is detected in which the mounting process can be continued, the selection section can select the mounting tool of the second type which differs from the mounting tool of the first type being mounted on the head. As a result, the abnormality occurring in the component mounter is resolved while the mounting process remains able to be continued by exchanging the mounting tools while the mounting operation remains able to be continued, thereby making it possible to suppress the occurrence of an abnormal situation in which the mounting operation cannot be continued.

EMBODIMENTS

Embodiment 1

Hereinafter, component mounter 10 according to an embodiment or Embodiment 1 will be described. Component mounter 10 is a device for mounting electronic component 4 on circuit board 2. Component mounter 10 is also referred to as an electronic component mounter or a chip mounter. Normally, component mounter 10 is provided together with other board work machines such as a solder printing machine and a board inspection machine to make up a series of mounting lines.

Figure 2:
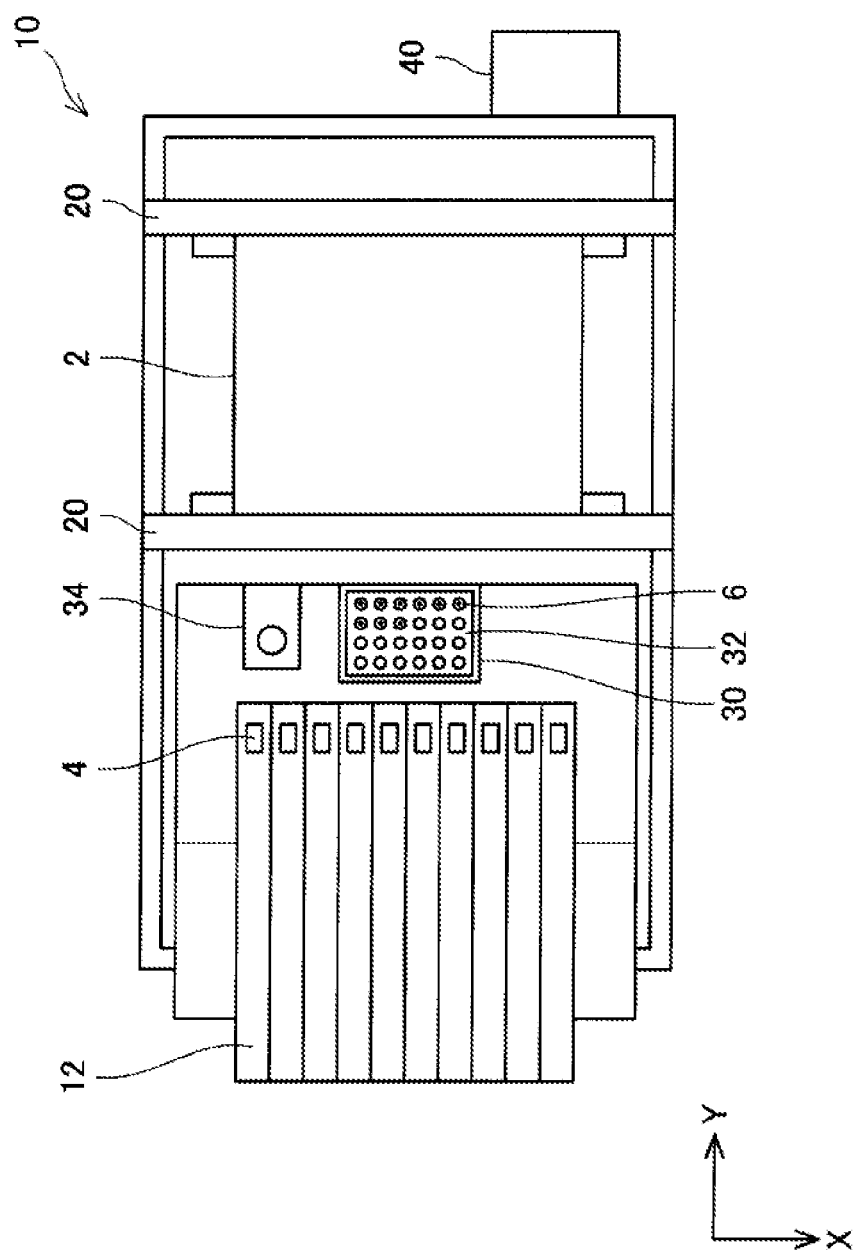
FIG. 2 is a cross-sectional view taken along line II-II shown in FIG. 1.

As shown in FIGS. 1, 2, component mounter 10 includes multiple component feeders 12, feeder holding section 14, mounting head 16, upper-face imaging camera 22, side-face image pickup unit 24, moving device 18 for moving mounting head 16, upper-face imaging camera 22, and side-face image pickup unit 24, board conveyor 20, nozzle accommodation section 30, nozzle holder 32, lower-face imaging camera 34, control device 40, and touch panel 42. PC 8, which is configured to communicate with component mounter 10, is disposed at an exterior portion of component mounter 10. Each component feeder 12 accommodates multiple electronic components 4. Component feeder 12 is detachably attached to feeder holding section 14 and supply electronic component 4 to mounting head 16. There is imposed no particular limitation on a specific configuration of component feeder 12. Each component feeder 12 may be made up, for example, of any one of a tape-type feeder which accommodates multiple electronic components 4 on a wound tape, a tray-type feeder that accommodates multiple electronic components 4 on a tray, and a bulk-type feeder that randomly accommodates multiple electronic components 4 within a container.

Feeder holding section 14 includes multiple slots, and component feeder 12 can be detachably placed in each of the multiple slots. Feeder holding section 14 may be such as to be fixed to component mounter 10 or may be detachably attached to component mounter 10.

Mounting head 16 has nozzle 6 configured to pick up electronic component 4. Nozzle 6 is detachably attached to mounting head 16. Mounting head 16 can move nozzle 6 in a Z direction (here, in a vertical direction) and moves nozzle 6 towards and away from component feeder 12 and circuit board 2. Mounting head 16 can pick up electronic component 4 from component feeder 12 using nozzle 6 and can mount electronic component 4 picked up with nozzle 6 on circuit board 2. Mounting head 16 is not limited to the mounting head having single nozzle 6 but may be a mounting head having multiple nozzles 6.

Moving device 18 moves mounting head 16, upper-face imaging camera 22, and side-face image pickup unit 24 between component feeder 12 and circuit board 2. As an exemplary configuration, moving device 18 of the present embodiment is an XY-robot configured to move movement base 18a in an X-direction and a Y-direction, and mounting head 16, upper-face imaging camera 22, and side-face image pickup unit 24 are fixed to movement base 18a. Mounting head 16 is not limited to the mounting head which is fixed to movement base 18a but may be a mounting head which is detachably attached to movement base 18a.

Upper-face imaging camera 22 is fixed to movement base 18a and moves together with movement base 18a. Upper-face imaging camera 22 is disposed in such a manner that its imaging direction is directed downwards and captures an image of an upper face of circuit board 2. For example, a CCD camera is used for the camera. Image data of an image captured with upper-face imaging camera 22 is stored in captured image memory section 52 (refer to FIG. 3) of memory 50.

Side-face image pickup unit 24 is fixed to movement base 18a and moves together with movement base 18a. Side-face image pickup unit 24 includes camera support section 26 and side-face imaging camera 28. Camera support section 26 is fixed to movement base 18a. Side-face imaging camera 28 is fixed below camera support section 26. Side-face imaging camera 28 is disposed in such a manner that its image picking-up direction is directed sideways so as to capture an image of a distal end portion of nozzle 6 sideways. That is, with nozzle 6 picking up electronic component 4 through suction, side-face imaging camera 28 captures an image of a side face of the distal end portion of nozzle 6 as well as an image of a side face of electronic component 4 so picked up with nozzle 6. For example, a CCD camera is used for the camera. Image data of the images captured with side-face imaging camera 28 are stored in captured image memory section 52 (refer to FIG. 3) of memory 50.

Board conveyor 20 is a device for conveying in, positioning, and conveying out circuit board 2. As an exemplary configuration, board conveyor 20 of the present embodiment has a pair of belt conveyors and a supporting device (not shown) configured to support circuit board 2 from below.

Nozzle accommodation section 30 is disposed between component feeders 12 and board conveyor 20 (to describe this in more details, of pair of board conveyors 20, board conveyor 20 disposed on a side facing component feeders 12). Nozzle accommodation section 30 can accommodate multiple nozzles 6 and executes reception and transfer of nozzle 6 from and to mounting head 16. Multiple nozzles 6 are accommodated in nozzle holder 32 attached to nozzle accommodation section 30. Nozzle holder 32 can accommodate nozzles 6 of multiple types. Nozzle holder 32 is detachably attached to nozzle accommodation section 30 and is removed from nozzle accommodation section 30, for example, when the operator exchanges nozzles 6 in nozzle holder 32.

Lower-face imaging camera 34 is disposed between component feeders 12 and board conveyor 20 (specifically speaking, of pair of board conveyors 20, board conveyor 20 disposed on the side facing component feeders 12). Lower-face imaging camera 34 is disposed in such a manner that its imaging direction is directed upwards so as to capture an image of nozzle 6 which picks up to hold electronic component 4 from below. That is, with nozzle 6 picking up electronic component 4, lower-face imaging camera 34 captures an image of a lower face of electronic component 4 picked up by nozzle 6. For example, a CCD camera is used for the camera. Image data of the image captured with lower-face imaging camera 34 is stored in captured image memory section 52 (refer to FIG. 3) of memory 50.

Figure 3:
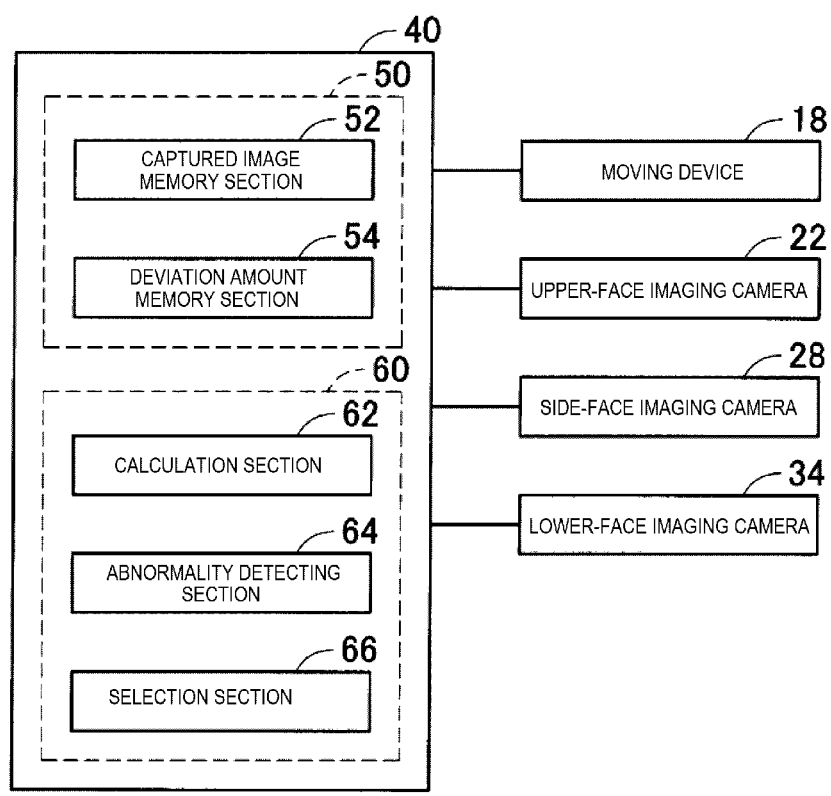
FIG. 3 is a block diagram showing functional blocks of a control device.

As shown in FIG. 3, control device 40 is configured by use of a computer including memory 50 and CPU 60. Captured image memory section 52 and deviation amount memory section 54 are provided in memory 50.

Picked-up image memory section 52 stores a captured image imaged by upper-face imaging camera 22, a captured image imaged by side-face imaging camera 28, and a captured image imaged by lower-face imaging camera 34 in a chronological order. The captured image imaged by upper-face imaging camera 22 is an image resulting, for example, when an upper face of circuit board 2 and an upper face of electronic component 4 mounted on circuit board 2 are imaged. The captured image imaged by side-face imaging camera 28 is an image resulting, for example, when a side face of electronic component 4, which is picked up with nozzle 6, and a side face of a distal end portion of nozzle 6 are imaged. The captured image captured by lower-face imaging camera 34 is an image resulting, for example, when a lower face of electronic component 4 picked up with nozzle 6 is imaged.

Deviation amount memory section 54 stores a deviation amount of a mounting position of electronic component 4 which is calculated at calculation section 62, which will be described later, as well as a deviation amount of a suction orientation and a deviation amount of a suction position of electronic component 4 picked up with nozzle 6. Deviation amount memory section 54 stores the deviation amounts in association with the captured image stored in captured image memory section 52.

An operation program is stored in memory 50, and CPU 60 functions as calculation section 62, abnormality detecting section 64, and selection section 66 when CPU 60 executes the operation program.

Calculation section 62 executes a calculation on the captured image sored in captured image memory section 52 to calculate a deviation amount of the position of electronic component 4 in the captured image. Specifically speaking, by comparing electronic component 4 in the captured image with a mounting position of electronic component 4 stored in advance in memory 50 (that is, a mounting position resulting when a mounting process is normally operated (hereinafter, also referred to as a normal position)), calculation section 62 calculates a deviation amount of a mounting position where electronic component 4 is actually mounted from the normal position.

Abnormality detecting section 64 detects whether an abnormal positional deviation is occurring in electronic component 4 in the captured image based on the deviation amount calculated at calculation section 62. Specifically speaking, abnormality detecting section 64 detects whether an abnormal positional deviation is occurring based on a threshold stored in advance in memory 50. In the present embodiment, memory 50 stores, as the thresholds, a first threshold set to determine whether the mounting position of electronic component 4 stays within such a range that prevents circuit board 2 from being determined as a defective product (hereinafter, also referred to as an allowable range), and stores a second threshold (< the first threshold) set to determine whether a deviation of the mounting position from the normal position is abnormal in the case that the mounting position of electronic component 4 stays within the allowable range. That is, in the event that the deviation amount of electronic component 4 exceeds the first threshold, the deviation is determined abnormal, whereby circuit board 2 is treated as a defective product, whereas in the event that the deviation amount of electronic component 4 falls within the first threshold, circuit board 2 is not treated as a defective product. However, in the event that the deviation amount of electronic component 4 exceeds the second threshold, although circuit board 2 is not treated as a defective product as a product, it means that an abnormal mounting position is occurring. Abnormality detecting section 64 detects whether an abnormal deviation is occurring with respect to the mounting position of electronic component 4 by determining whether the deviation amount calculated at calculation section 62 stays within the first threshold and determining whether the deviation amount in question is equal to or larger than the second threshold.

Selection section 66 selects nozzle 6 to be mounted on mounting head 16 from multiple nozzles 6 accommodated in nozzle accommodation section 30 based on the detection results detected at abnormality detecting section 64. As described above, since nozzles 6 of the multiple types are accommodated in nozzle accommodation section 30, selection section 66 selects a type of nozzle 6 to be mounted on mounting head 16. Specifically speaking, selection section 66 determines whether nozzle 6 of the same type as nozzle 6 being mounted on mounting head 16 is to be selected or nozzle 6 of a different type is to be selected.

Touch panel 42 is not only a display device for providing the operator with various types of information but also a user interface for receiving a command or information from the operator. For example, touch panel 42 can display the detection result of abnormality detecting section 64 in relation to the abnormality of nozzle 6 and the type of nozzle 6 selected by selection section 66.

Figure 4:
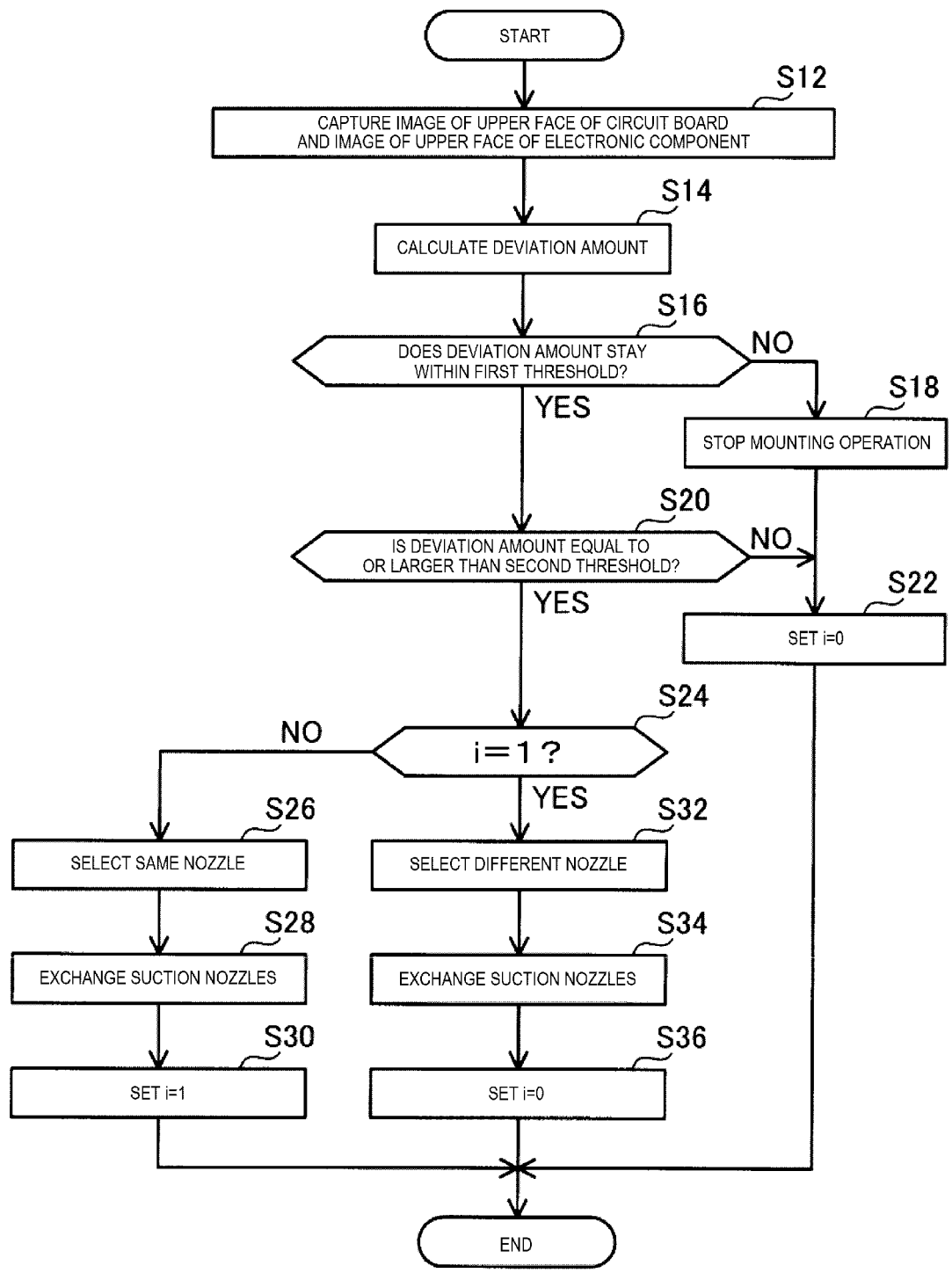
FIG. 4 is a flowchart showing an example of a series of processing operations of exchanging nozzles which are mounted on a mounting head in Embodiment 1.

FIG. 4 is a flowchart showing an example of a process of exchanging mounting nozzle 6 to be mounted on mounting head 16. Component mounter 10 stops the mounting process when the mounting position where electronic component 4 is mounted on circuit board 2 constitutes such a position that circuit board 2 is treated as a defective product. In other words, in the event that the mounting position stays within the allowable range, the mounting process is enabled to continue. However, there exist a case in which although the mounting process is enabled to continue, the mounting position of electronic component 4 is normal and a case in which although the mounting position stays within the allowable range, the mounting position deviates from the normal position, resulting in an abnormal state (hereinafter, the deviation of this type may be referred to as an "abnormal positional deviation within the allowable range" from time to time). Various reasons are considered as causes for such an abnormal positional deviation within the allowable range, and as one of them, a cause attributed to nozzle 6 is raised. As a cause attributed to nozzle 6, for example, there can be raised a case in which a certain defect exists in nozzle 6 itself used, a case in which a type of nozzle 6 used is not suitable for picking up through suction electronic component 4 and moving it to the mounting position, and the like. Hereinafter, there will be described a procedure of exchanging nozzles 6 to be mounted on mounting head 16 based on a deviation amount of the mounting position of electronic component 4. In the following description, the number of times of exchanging nozzles 6 of the same type after an abnormal positional deviation within the allowable range is detected (a positive determination of YES is made in step S20, which will be described later) is referred to as i (i is 0 or 1) time. That is, in the present embodiment, if the abnormal positional deviation within the allowable range is detected, firstly, nozzle 6 on mounting head 16 is exchanged for nozzle 6 of the same type. If the abnormal positional deviation within the allowable range continues to occur even after nozzles 6 on mounting head 16 is exchanged for nozzle 6 of the same type, nozzle 6 on mounting head 16 is exchanged for nozzle 6 of a different type. Consequently, in order to determine whether nozzle 6 on mounting head 16 is exchanged for nozzle of a different type, the number of times i of exchanging nozzle 6 on mounting head 16 for nozzle 6 of the same type is stored in memory 50.

As shown in FIG. 4, firstly, control device 40 captures an image of an upper face of circuit board 2 and an image of an upper face of electronic component 4 mounted on circuit board 2 using upper-face imaging camera 22 (S12). The image pickup process by upper-face imaging camera 22 is executed while following a procedure below. Firstly, control device 40 moves movement base 18a so that an optical axis of upper-face imaging camera 22 coincides with a predetermined coordinate (a reference position set on an upper face of circuit board 2). The predetermined coordinate is, for example, a coordinate of a center of electronic component 4 when electronic component 4 is mounted in the normal position on circuit board 2. Subsequently, control device 40 causes upper-face imaging camera 22 to capture an image of an upper face of circuit board 2 and an image of an upper face of electronic component 4. The captured image data is stored in captured image memory section 52.

Next, calculation section 62 calculates a deviation amount of electronic component 4 from the mounting position from the captured image imaged in step S12 (S14). Specifically speaking, calculation section 62 compares the normal position of electronic component 4 stored in advance in memory 50 with the position of electronic component 4 in the captured image to thereby calculate a deviation amount of the mounting position of electronic component 4 from the normal position. The deviation amount of the mounting position of electronic component 4 is calculated by using three parameters including, for example, a deviation amount $\Delta X$ in the X direction, and a deviation amount $\Delta Y$ in the Y direction, and a deviation amount $\Delta \theta$ in a rotation direction. The deviation amount ($\Delta X$, $\Delta Y$, $\Delta \theta$) so calculated are stored in deviation amount memory section 54.

Next, abnormality detecting section 64 determines whether the deviation amount calculated in step S14 stays within the first threshold (S16). The first threshold is set, for example, by combining a value in the X direction ($\Delta X1$), a value in the Y direction ($\Delta Y1$) and a value in the rotational direction ($\Delta \theta 1$) within a range where the mounting position of electronic component 4 stays within the allowable range. Then, abnormality detecting section 64 determines whether any one of the deviation amounts ($\Delta X$, $\Delta Y$, $\Delta \theta$) calculated in step S14 exceeds any one of $\Delta X1$, $\Delta Y1$, $\Delta \theta 1$ which make up the first threshold. If abnormality detecting section 64 determines that the deviation amount calculated in step S14 does not stay within the first threshold value (if NO in step S16), determining that electronic component 4 is mounted in such a position that causes resulting circuit board 2 to be treated as a defective product, abnormality detecting section 64 stops the mounting process of component mounter 10 (S18). Thus, in the event that any one of three parameters $\Delta X$, $\Delta Y$, $\Delta \theta$ representing the deviation amount calculated in step S14 exceeds any one of corresponding values $\Delta X1$, $\Delta Y1$, $\Delta \theta 1$ which make up the first threshold, the mounting process is stopped. Thereafter, the process proceeds to step S22. A process in step S22 will be described later.

On the other hand, if the deviation amount calculated in step S14 stays within the first threshold (if YES in step S16, that is, $\Delta X$, $\Delta Y$, $\Delta \theta$ all stay within $\Delta X1$, $\Delta Y1$, $\Delta \theta 1$, respectively, which make up the first threshold), abnormality detecting section 64 determines that electronic component 4 is mounted in such a position that prevents resulting circuit board 2 from being treated as a defective product. Subsequently, abnormality detecting section 64 determines whether the deviation amount calculated in step S14 is equal to or larger than the second threshold (S20). The second threshold is set in order to determine whether the mounting position of electronic component 4 is normal and has threshold $\Delta X2$ in the X-direction, threshold $\Delta Y2$ in the Y-direction, and threshold $\Delta \theta 2$ in the rotational direction. Therefore, in step S20, abnormality detecting section 64 determines whether the deviation amount of electronic component 4 calculated in step S14 is normal. Specifically speaking, value $\Delta X$ in the X-direction, value $\Delta Y$ in the Y-direction, and value $\Delta \theta$ in the rotational direction, which are calculated in step S14, are all less than corresponding second thresholds $\Delta X2$, $\Delta Y2$, $\Delta \theta 2$, abnormality detection section 64 determines that the deviation amount is less than the second threshold. On the other hand, if one or more in value ΔX in the X-direction, value ΔY in the Y-direction, and value Δθ in the rotational direction are equal to or larger than the corresponding second thresholds, abnormality detecting section 64 determines that the deviation amount is equal to or larger than the second threshold.

If the deviation amount calculated in step S14 is not equal to or larger than the second threshold (if NO in step S20), abnormality detecting section 64 determines that the mounting position of electronic component 4 is normal. That is, since the mounting process of electronic component 4 carried out using nozzle 6 currently mounted on mounting head 16 is normal, there is no need to exchange current nozzle 6 for another nozzle 6. As a result, no nozzle 6 is exchanged. If the mounting process carried out by component mounter 10 is stopped in step S18 described above, since the mounting process itself is stopped, no nozzle 6 is exchanged. Consequently, if the mounting process carried out by component mounter 10 is stopped in step S18, and if the deviation amount is not equal to or larger than the second threshold (if NO in step S20), the number of times of exchanging nozzle 6 on mounting head 16 for nozzle 6 of the same type is referred to as 0 (i=0) (S22). Thereafter, the series of processes shown in FIG. 4 ends.

On the other hand, if the deviation amount calculated in step S14 is equal to or larger than the second threshold (if YES in step S20), abnormality detecting section 64 determines that an abnormal positional deviation within the allowable range is occurring in the mounting position of electronic component 4. Subsequently, after the abnormal positional deviation within the allowable range occurs, abnormality detecting section 64 determines whether the number i of times of exchanging nozzle 6 on mounting head 16 for nozzle 6 of the same type is 1 (S24). If the process of exchanging nozzle 6 on mounting head 16 for nozzle 6 of the same type is performed in the previous process, the number i of times of exchanging nozzle 6 on mounting head 16 for nozzle 6 of the same type is 1. Consequently, abnormality detecting section 64 determines whether the mounting process is executed continuously by using nozzle 6 of the same type in step S24.

If i=1 is not satisfied (if NO in step S24), that is, if the abnormal positional deviation within the allowable range is not occurring continuously with nozzle 6 of the same type used, selection section 66 selects nozzle 6 of the same type as nozzle 6 currently mounted on mounting head 16 from multiple nozzles 6 accommodated in nozzle accommodation section 30 (S26). As a cause for the positional deviation, there is a possibility that a defect occurs in nozzle 6 itself which is currently mounted on mounting head 16. In this case, in the event that the mounting process is executed using another nozzle 6 of the same type as nozzle 6 currently mounted on mounting head 16, the occurring positional deviation is resolved. Then, selection section 66 firstly selects another nozzle 6 of the same type.

Next, control device 40 exchanges nozzles 6 to be mounted on mounting head 16 so that nozzle 6 selected in step S26 (that is, another nozzle 6 of the same type) is mounted on mounting head 16 (S28). Thereafter, control device 40 counts as i=1, and causes the count to be stored in memory 50 (S30).

On the other hand, if i=1 is satisfied (if YES in step S24), that is, if the mounting process is executed continuously using nozzle 6 of the same type, selection section 66 selects nozzle 6 of a different type from nozzle 6 currently mounted on mounting head 16 from multiple nozzles 6 accommodated in nozzle accommodation section 30 (S32). Specifically speaking, selection section 66 selects nozzle 6 having a diametrical dimension which differs from a diametrical dimension of nozzle 6 currently mounted on mounting head 16. To describe this in more details, selection section 66 selects nozzle 6 having a diametrical dimension which is larger than the diametrical dimension of nozzle 6 currently mounted on mounting head 16. Here, since i=1 is satisfied, the abnormal positional deviation of the mounting position of electronic component 4 within the allowable range is occurring continuously as a result of the mounting process being carried out while using continuously nozzle 6 of the same type. For this reason, there is a high possibility that the abnormal positional deviation within the allowable range is caused because the type of nozzle 6 is not suitable for the mounting process of electronic component 4, although nozzle 6 itself has no problem. In particular, there is a possibility that electronic component 4 is too large for nozzle 6 currently mounted on mounting head 16. Accordingly, selection section 66 selects nozzle 6 having the larger diametrical dimension than the diametrical dimension of nozzle 6 currently mounted on mounting head 16 (that is, nozzle 6 generating a larger suction force).

Next, control device 40 exchanges nozzles 6 to be mounted on mounting head 16 so that nozzle 6 selected in step S32 (that is, nozzle 6 of the different type) is mounted on mounting head 16 (S34). Thereafter, determining that i=0 is satisfied, control device 40 causes i=0 to be stored in memory 50 (S36).

In the present embodiment, in the event that the abnormal positional deviation of the mounting position of electronic component 4 within the allowable range is continuously occurring, nozzle 6 currently mounted on mounting head 16 is exchanged for nozzle 6 having the larger diametrical dimension than that of nozzle 6 on mounting head 16. As described above, the deviation of the mounting position of electronic component 4 tends to occur easily in the case that electronic component 4 is too large for nozzle 6 currently mounted on mounting head 16. In this case, although the positional deviation of the mounting position of electronic component 4 can also be resolved by reducing the moving acceleration of nozzle 6, there is caused a problem in that the time of the mounting process is lengthened as a result of the moving acceleration of nozzle 6 being reduced. In the present embodiment, the abnormal positional deviation of electronic component 4 within the allowable range can be resolved without making the moving speed of nozzle 6 slower by exchanging nozzle 6 on mounting head 16 for nozzle 6 having the larger diametrical dimension. In addition, since nozzle 6 on mounting head 16 is exchanged for nozzle 6 of the suitable type while the mounting position of electronic component 4 stays within the allowable range, the mounting process can be prevented in advance from being stopped which would otherwise be caused by the occurrence of the positional deviation exceeding the allowable range.

In the present embodiment, selection section 66 selects nozzle 6 having the larger diametrical dimension than the diametrical dimension of nozzle 6 currently mounted on mounting head 16 in step S32; however, the present disclosure is not limited to this configuration. Nozzle 6, which is of a type able to move electronic component 4 to be mounted and of the different type from nozzle 6 currently mounted on mounting head 16, only needs to be selected from multiple nozzles 6 accommodated in nozzle accommodation section 30, and hence, the diametrical dimension of nozzle 6 that selection section 66 selects does not always have to be increased. In some cases, nozzle accommodation section 30 does not accommodate nozzle 6 of a desired type. Control device 40 can exchange nozzle 6 currently mounted on mounting head 16 for nozzle 6 of the different type from that of nozzle 6 mounted on mounting head 16 without stopping the mounting process by selecting nozzle 6 of the different type from multiple nozzles 6 accommodated in nozzle accommodation section 30 as required.

In the present embodiment, selection section 66 selects nozzle 6 of the different type in the event that i=1 is satisfied in step S24; however, the present disclosure is not limited to this configuration. For example, i may be set to 2 or greater. That is, selection section 66 may select nozzle 6 of a different type in the event that the abnormal positional deviation within the allowable range still occurs in relation to the mounting position even though nozzle 6 on mounting head 16 is exchanged continuously for another nozzle 6 of the same type over a predetermined number of times (that is, a predetermined number of three or more times) after the abnormal positional deviation within the allowable range is detected initially. Further, a condition of selection of nozzle 6 of a different type by selection section 66 is not limited to the case in which the abnormal positional deviation within the allowable range occurs continuously in relation to the mounting position when nozzle 6 on mounting head 16 is exchanged for another nozzle 6 of the same type. For example, in the event that the abnormal positional deviation of the mounting position within the allowable range is generated at a predetermined frequency or more frequently when nozzle 6 on mounting head 16 is exchanged for nozzle 6 of the same time over multiple times, selection section 66 may select nozzle 6 of a different type.

In the present embodiment, electronic component 4 is moved while being picked up with nozzle 6; however, the present disclosure is not limited to this configuration. Electronic component 4 only needs to be able to be moved from component feeder 12 to the predetermined position on circuit board 2, and hence, for example, electronic component 4 may be moved by a gripping device (a gripping tool) configured to grip on electronic component 4. In this case, component mounter includes a tool accommodation section accommodating gripping tools of multiple types (that is, gripping tools of multiple types having different griping forces), so that when abnormality is caused in relation to the mounting position of electronic component 4, the gripping tool mounted on the mounting head only needs to be exchanged for a gripping tool accommodated in the tool accommodation section.

Further, in the present embodiment, control device 40 causes nozzle 6 mounted on mounting head 16 to be exchanged for nozzle 6 selected by selection section 66 in step S28 and step S34; however, the present disclosure is not limited to this configuration. For example, control device 40 does not have to execute the process of exchanging nozzle 6 on mounting head 16 for nozzle 6 selected as described above, and hence, the selection result of selection section 66 may be displayed on touch panel 42. As a result, the operator can be aware of the selection result of selection section 66, that is, the operator can be aware of the state in which the exchange of nozzles 6 is recommended. As described above, even though the abnormal positional deviation within the allowable range is caused, the continuation of the mounting process is not interrupted. Therefore, the operator may immediately determine whether to exchange nozzles 6 so as to execute the nozzle exchange at an appropriate timing.

Embodiment 2

In Embodiment 1 that has been described above, the positional deviation of electronic component 4 mounted on circuit board 2 is detected, and the type of nozzle 6 to be mounted on mounting head 16 is selected; however, the present disclosure is not limited to this configuration. For example, a type of nozzle 6 to be mounted on mounting head 16 may be selected by detecting a deviation of a suction orientation of electronic component 4 by nozzle 6 from a imaged image resulting from capturing an image of electronic component 4 which is being moved by nozzle 6. In the present embodiment, processing executed by calculation section 62 and abnormality detecting section 64 differ from those described in Embodiment 1, and the other processing remain the same as those described in Embodiment 1. For this reason, the description of the same processing as those of Embodiment 1 will be omitted here.

Figure 5:
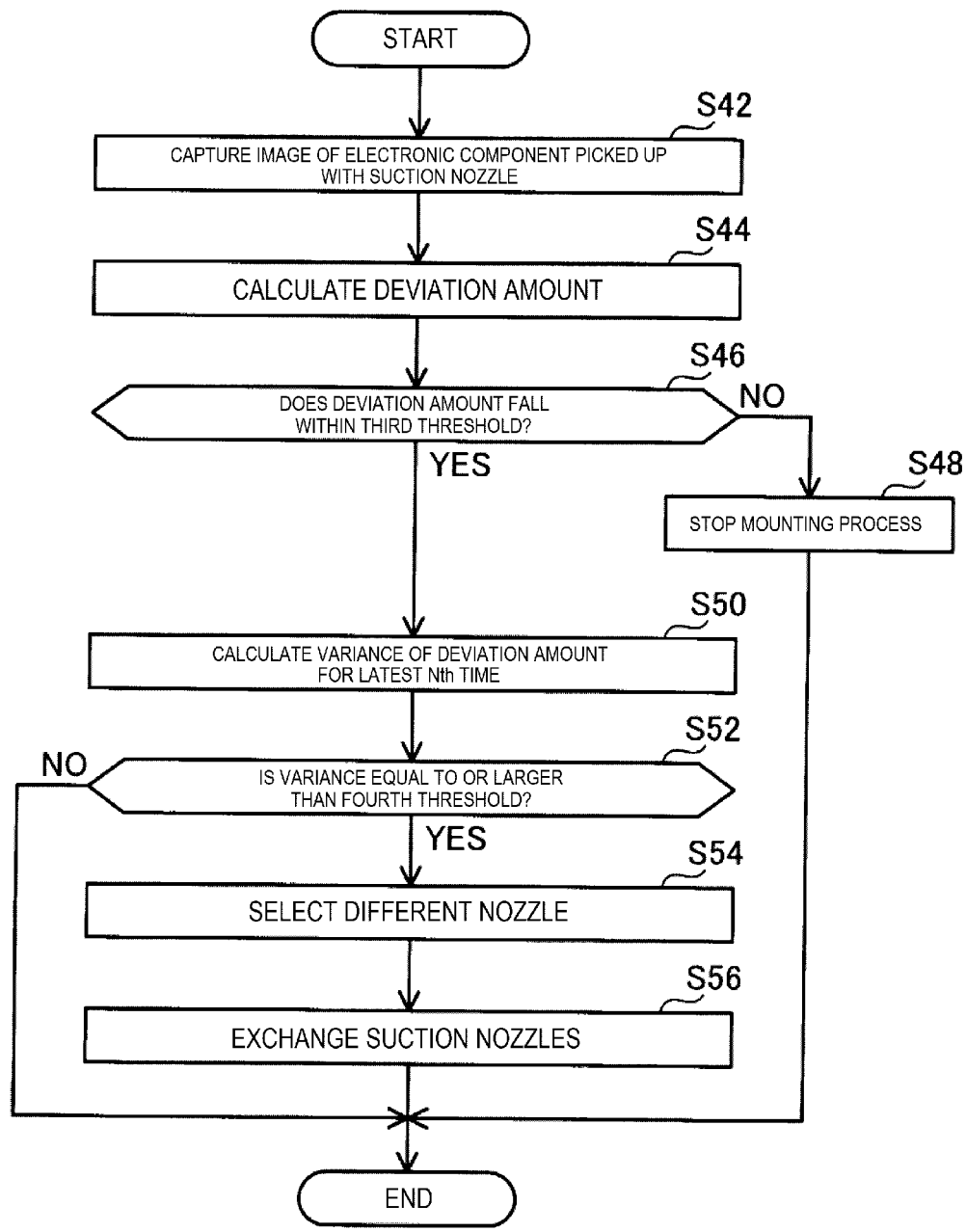
FIG. 5 is a flowchart showing an example of a series of processing operations of exchanging nozzles which are mounted on a mounting head in Embodiment 2.

FIG. 5 is a flowchart showing an example of a process of exchanging nozzles 6 to be mounted on mounting head 16 in the present embodiment. In the present embodiment, whether abnormality is occurring is determined based on a suction orientation of electronic component 4 when electronic component 4 is picked up with nozzle 6. More specifically speaking, in the event that the suction orientation of electronic component 4 deviates greatly from a normal orientation, a mounting process is stopped, and nozzle 6 mounted on mounting nozzle 16 is exchanged for nozzle 6 of a different type when the suction orientation of electronic component 4 varies greatly although the suction orientation stays within an allowable range.

As shown in FIG. 5, firstly, control device 40 causes side-face imaging camera 28 to capture an image of electronic component 4 picked up with nozzle 6 from a side thereof (S42). The image pickup process by side-face imaging camera 28 is executed in the following procedure. Firstly, control device 40 causes movement base 18a to move so that nozzle 6 is positioned above electronic component 4 supplied from component feeder 12. Next, control device 40 causes mounting head 16 to move downwards, so that electronic component 4 is picked up with nozzle 6. Subsequently, control device 40 causes mounting head 16 to move upwards with electronic component 4 kept held through suction to nozzle 6, so that a side face of electronic component 4 and a side face of a distal end portion of nozzle 6 are positioned within an image pickup region of side-face imaging camera 28. Then, control device 40 causes side-face imaging camera 28 to capture images of the side face of electronic component 4, which is kept held through suction to nozzle 6, and the side face of the distal end portion of nozzle 6. The image data so captured is stored in memory 50.

Next, calculation section 62 calculates a deviation amount of a suction orientation of electronic component 4 from the image captured in step S42 (S44). Specifically speaking, calculation section 62 calculates a deviation amount of the suction orientation of electronic component 4 by comparing a normal suction orientation of electronic component 4 stored in advance in memory 50 and a suction orientation of electronic component 4 in the captured image. A deviation amount of the suction orientation of electronic component 4 is calculated by use of three parameters such as, for example, a deviation amount $\Delta X$ in an X-direction, a deviation amount $\Delta Z$ in a Z-direction, and a deviation amount $\Delta \theta$ in a rotational direction in an XZ plane. The deviation amount so calculated is stored in deviation amount memory section 54.

Next, abnormality detecting section 64 determines whether the deviation amount calculated in step S44 falls within a third threshold (S46). In the event that the suction orientation of electronic component 4 deviates greatly, a state in which electronic component 4 is kept picked up or held cannot be maintained during movement of electronic component 4, or electronic component 4 is mounted in a position lying beyond an allowable range. The third threshold is such that a value ΔX3 in the X-direction, a value ΔZ3 in the Z-direction, and a value Δθ3 in the rotation direction are set so that the state in which electronic component 4 is kept picked up during the movement of electronic component 4 can be maintained and the mounting position of electronic component 4 falls within the allowable range.

If the deviation amount calculated in step S44 does not fall in the third threshold (if NO in step S46), determining that the mounting process is disenabled to continued, abnormality detecting section 64 stops the mounting process of component mounter 10 (S48). Then, control device 40 ends the series of processes shown in FIG. 5.

On the other hand, if the deviation amount calculated in step S44 falls within the third threshold (if YES in step S46), abnormality detecting section 64 determines that the mounting process is enabled to continue. Next, calculation section 62 calculates variance a of a deviation amount of a nearest nth time (n is a natural number of 1 or larger) including the deviation amount calculated in step S44 (S50). A deviation amount of a nearest nth−1 time is stored in deviation memory section 54. Calculation section 62 acquires the deviation amount of the nearest nth−1 time from deviation amount memory section 54 and calculates variance a for the deviation amount calculated in step S44 and the deviation amount of the nearest nth−1 time.

Next, abnormality detecting section 64 determines whether variance a calculated in step S46 is equal to or larger than a fourth threshold (S52). The fourth threshold is set to determine whether the suction orientation of electronic component 4 varies abnormally. Therefore, in step S52, abnormality detecting section 64 determines whether the suction orientation of electronic component 4 varies abnormally.

If variance a calculated in step S50 is not equal to or larger than the fourth threshold (if NO in step S52), abnormality detecting section 64 determines that the deviation amount of the suction orientation of electronic component 4 of the nearest nth time does not vary abnormally and hence that electronic component 4 is picked up by nozzle 6 stably. As a result, control device 40 ends the series of processes shown in FIG. 5 without exchanging nozzles 6.

On the other hand, if variance a calculated in step S50 is equal to or larger than the fourth threshold (if YES in step S52), abnormality detecting section 64 determines that the deviation amount of the suction orientation of electronic component 4 of the nearest nth time varies and hence that electronic component 4 is not picked up by nozzle 6 stably. Then, selection section 66 selects nozzle 6 of a different type from nozzle 6 currently mounted on mounting head 16 from multiple nozzles 6 accommodated in nozzle accommodation section 30 (S54). Specifically speaking, selection section 66 selects nozzle 6 having a diametrical dimension which differs from a diametrical dimension of nozzle 6 currently mounted on mounting head 16. To describe this in more detail, selection section 66 selects nozzle 6 having a diametrical dimension which is larger than the diametrical dimension of nozzle 6 currently mounted on mounting head 16. Then, control device 40 causes nozzle 6 currently mounted on mounting nozzle 16 to be exchanged for nozzle 6 selected in step S54 (that is, nozzle 6 of the different type), so that nozzle 6 of the different type is mounted on mounting head 16 (S56).

In the present embodiment, the variance a of the nearest nth time of the deviation amount of the suction orientation of electronic component 4 is calculated, so as to determine whether nozzle 6 of a different type is selected based on the magnitude of the variance a (that is, the variation of the deviation amount of the suction orientation); however, the present disclosure is not limited to this configuration. For example, in Embodiment 2, a similar determination to the processing method of Embodiment 1 may be made to the deviation amount of the suction orientation of electronic component 4 calculated in step S44. That is, in the event that the deviation amount of the suction orientation of electronic component 4 is equal to or larger than a predetermined value (corresponding to the second threshold of Embodiment 1), nozzle 6 mounted on mounting head 16 is exchanged for nozzle 6 of the same type at first, and then, in the event that deviations of the predetermined value or larger are generated continuously in the suction orientation of electronic component 4 while using nozzle 6 of the same type, nozzle 6 on mounting head 16 may then be exchanged for nozzle 6 of a different type. Similarly, the processing method of Embodiment 2 (that is, the determination method of determining the variance (the stability of the mounting position)) may also be applied to the positional deviation of the mounting position of electronic component 4 in Embodiment 1.

In addition, the type of nozzle 6 to be mounted on mounting head 16 is selected by detecting the deviation of electronic component 4 mounted on circuit board 2 in Embodiment 1 and by detecting the deviation of the suction orientation of electronic component 4 due to nozzle 6 in Embodiment 2; however, the present disclosure is not limited to these configurations. For example, the type of nozzle 6 to be mounted on mounting head 16 may be selected by detecting the deviation of electronic component 4 in a state of being picked up with nozzle 6 from the image captured by lower-face imaging camera 34. In this case, calculation section 62 can calculate a deviation in the X-direction, a deviation in the Y-direction, and a deviation in the rotational direction of electronic component 4 in the state of being picked up by nozzle 6 based on the image captured by lower-face imaging camera 34. Then, the type of nozzle 6 to be mounted on mounting head 16 may be selected based on the deviation amount of electronic component 4 calculated at calculation section 62 (that is, the deviation amount of the suction position of electronic component 4 kept picked up by nozzle 6). In addition, the type of nozzle 6 to be mounted on mounting head 16 may be selected by combining the deviation of the suction position of electronic component 4 detected from the captured image of lower-face imaging camera 34 and the deviation of the mounting position of electronic component 4 detected from the captured image of upper-face imaging camera 22. For example, when the deviation of the suction position of electronic component 4 is detected from the captured image of lower-face imaging camera 34, the mounting position of electronic component 4 is corrected by an amount corresponding to the deviation so detected, whereby electronic component 4 is mounted on circuit board 2. Even though the mounting position is corrected in the way described above, there may be a case in which the deviation of the mounting position of electronic component 4 is detected from the captured image of upper-face imaging camera 22. In such a case, determining that the type of nozzle 6 is not suited to electronic component 4, selection section 66 may select nozzle 6 of a different type.

Further, in the present embodiment, the variance is calculated by use of the deviation amount of the suction orientation of electronic component 4 of the nearest nth−1 time that is stored in deviation amount memory section 54 of control device 40; however, the present disclosure is not limited to this configuration. For example, an error occurrence probability may be calculated by accumulating captured images of suction orientations of electronic components 4 in a database, and analyzing all the deviations of the suction orientations of electronic components 4 that have been caused until then. For analysis, all the data acquired from component mounter 10 in question may be used, or the data acquired from another component mounter 10 may be included. In order to analyze these data, component mounter 10 may be configured so as to calculate an error occurrence probability through machine learning making use of AI or the like. Then, in the event that the analysis determines that the error occurrence probability is high, nozzle 6 mounted on mounting head 16 may be exchanged for nozzle 6 of a different type. The data for use in calculating an error occurrence probability using the data accumulated in the database is not limited to the image data including the captured suction orientation of electronic component 4. Any data or information can be employed, provided that data or information relates to the mounting process, and for example, image data including a captured mounting position of electronic component 4 mounted on circuit board 2 may be employed, or information relating to nozzle 6 or information relating to component feeder 12 may also be employed.

Thus, while the specific examples of the technology disclosed in the present description have been described in detail, they are only the examples and do not limit the scope of claims in any way. The technology described in the claims includes those in which the specific examples described above are modified or altered variously. In addition, the technical elements described in the present description or the drawings exhibit technical usefulness alone or in various combinations and are not limited to the combinations described in the claims for application for patent.

The invention claimed is:

1. A component mounter for mounting an electronic component on a board, comprising:
   a mounting tool configured to receive the electronic component in a component supply position and release the electronic component so received in a predetermined position on the board;
   an accommodation section accommodating mounting tools of multiple types;
   a head configured to detachably mount thereon a single mounting tool selected from the mounting tools of multiple types accommodated in the accommodation section;
   an XY robot configured to move the head between the component supply position and the predetermined position on the board;
   an abnormality detecting section configured to detect abnormality in relation to the mounting tool;
   a selection section configured to select the single mounting tool of the multiple tools to be mounted on the head, and select a mounting tool of a second type, which differs from a mounting tool of a first type which is being mounted on the head, when the abnormality is detected by the abnormality detecting section; and
   a camera for capturing an image of the board after the electronic component is mounted thereon,
   wherein the abnormality includes a positional deviation of the electronic component on the board, the positional deviation being detected from the captured image, and
   wherein the mounting tool of the second type can hold an electronic component larger than an electronic component the mounting tool of the first type can hold.

2. The component mounter according to claim 1,
   wherein the component mounter further comprises processing circuitry configured to control an exchanging process of the mounting tool which is mounted on the head, and
   wherein, in the event that the selection section selects the mounting tool of the second type and when the mounting tool of the second type is accommodated in the accommodation section, the processing circuitry executes the exchanging process so that the mounting tool of the second type is mounted on the head.

3. A component mounter for mounting an electronic component on a board, comprising:
   a mounting tool configured to receive the electronic component in a component supply position and release the electronic component so received in a predetermined position on the board;
   an accommodation section accommodating mounting tools of multiple types;
   a head configured to detachably mount thereon a single mounting tool selected from the mounting tools of multiple types accommodated in the accommodation section;
   an XY robot configured to move the head between the component supply position and the predetermined position on the board;
   an abnormality detecting section configured to detect abnormality in relation to the mounting tool;
   a selection section configured to select the single mounting tool of the multiple tools to be mounted on the head, and select a mounting tool of a second type, which differs from a mounting tool of a first type which is being mounted on the head, when the abnormality is detected by the abnormality detecting section; and
   a camera capturing an image of the mounting tool, during which is moving the electronic component from the component supply position towards a predetermined position on the board, and the electronic component,
   wherein the abnormality includes a posture deviation of the electronic component, which is detected from the captured image during moving, and
   wherein the mounting tool of the second type is capable of moving an electronic component larger than an electronic component the mounting tool of the first type can move.

4. A component mounter for mounting an electronic component on a board, comprising:
   a mounting tool configured to receive the electronic component in a component supply position and release the electronic component so received in a predetermined position on the board;
   an accommodation section accommodating mounting tools of multiple types;
   a head configured to detachably mount thereon a single mounting tool selected from the mounting tools of multiple types accommodated in the accommodation section;
   an XY robot configured to move the head between the component supply position and the predetermined position on the board;
   an abnormality detecting section configured to detect abnormality in relation to the mounting tool; and
   a selection section configured to select the single mounting tool of the multiple tools to be mounted on the head, and select a mounting tool of a second type, which differs from a mounting tool of a first type which is being mounted on the head, when the abnormality is detected by the abnormality detecting section,
wherein the abnormality detecting section detects a first abnormality which enables the component mounter to continue the mounting process thereof, and a second abnormality which disenables the component mounter to continue the mounting process thereof, and
wherein, in a case of abnormality detected at the abnormality detecting section being the first abnormality, the selection section is enabled to select the mounting tool of the second type which differs from the mounting tool of the first type that is being mounted on the head.

* * * * *